(12) United States Patent
Yoon et al.

(10) Patent No.: US 8,946,744 B2
(45) Date of Patent: Feb. 3, 2015

(54) LIGHT EMITTING DIODE

(75) Inventors: Yeo Jin Yoon, Ansan-si (KR); Won Cheol Seo, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 12/974,605

(22) Filed: Dec. 21, 2010

(65) Prior Publication Data

US 2011/0156070 A1 Jun. 30, 2011

(30) Foreign Application Priority Data

Dec. 28, 2009 (KR) .................. 10-2009-0131693

(51) Int. Cl.
*H01L 33/00* (2010.01)

(52) U.S. Cl.
USPC ............ 257/98; 257/88; 257/71; 257/E33.06; 257/E33.05

(58) Field of Classification Search
USPC ........ 257/98, E33.06, E33.05, 71, 72, 99, 79, 257/88; 438/22, 25, 26, 27, 29
See application file for complete search history.

(56) References Cited

U.S. PATENT DOCUMENTS

| | | | |
|---|---|---|---|
| 2006/0169994 A1 | 8/2006 | Tu et al. | |
| 2006/0231852 A1* | 10/2006 | Kususe et al. | 257/99 |
| 2007/0145380 A1 | 6/2007 | Shum et al. | |
| 2009/0065800 A1* | 3/2009 | Wirth et al. | 257/100 |
| 2009/0108250 A1 | 4/2009 | Kim et al. | |
| 2009/0114935 A1 | 5/2009 | Huang et al. | |
| 2009/0309107 A1* | 12/2009 | Kang | 257/88 |
| 2011/0127568 A1* | 6/2011 | Donofrio et al. | 257/99 |
| 2011/0180831 A1 | 7/2011 | Song | |
| 2012/0207185 A1* | 8/2012 | Kuramoto et al. | 372/44.01 |

FOREIGN PATENT DOCUMENTS

| | | |
|---|---|---|
| EP | 1256987 | 11/2002 |
| JP | 2000-114595 | 4/2000 |
| JP | 2002-353504 | 12/2002 |
| JP | 2005-136177 | 5/2005 |
| JP | 2006-012916 | 1/2006 |
| JP | 2009-111342 | 5/2009 |

(Continued)

OTHER PUBLICATIONS

European Search Report issued for related European Patent Application No. 10192249.0 dated Sep. 7, 2012.

(Continued)

*Primary Examiner* — Cathy N Lam
(74) *Attorney, Agent, or Firm* — H.C. Park & Associates, PLC

(57) ABSTRACT

The present invention provides a light emitting diode including a lower semiconductor layer formed on a substrate; an upper semiconductor layer disposed above the lower semiconductor layer, exposing an edge region of the lower semiconductor layer; a first electrode formed on the upper semiconductor layer; an insulation layer interposed between the first electrode and the upper semiconductor layer, to supply electric current to the lower semiconductor layer; a second electrode formed on another region of the upper semiconductor layer, to supply electric current to the upper semiconductor layer. The first electrode includes an electrode pad disposed on the upper semiconductor layer and an extension extending from the electrode pad to the exposed lower semiconductor layer. The insulation layer may have a distributed Bragg reflector structure.

5 Claims, 6 Drawing Sheets

(56) References Cited

FOREIGN PATENT DOCUMENTS

| | | |
|---|---|---|
| JP | 2009-146980 | 7/2009 |
| TW | I244228 | 11/2005 |
| WO | 2009/020365 | 2/2009 |
| WO | 2009/125953 | 10/2009 |

OTHER PUBLICATIONS

European Search Report submitted with European Application 10192249.0 dated Aug. 1, 2013.

* cited by examiner (Prior Art)

(Prior Art)

LIGHT EMITTING DIODE

CROSS-REFERENCE TO RELATED APPLICATION

This application claims priority from and the benefit of Korean Patent Application No. 2009-0131693, filed on Dec. 28, 2009, which is hereby incorporated by reference for all purposes as if fully set forth herein.

BACKGROUND OF THE INVENTION

1. Field of the Invention

Exemplary embodiments of the invention relate to light emitting diodes.

2. Description of the Background

Gallium nitride (GaN) based light emitting diodes (LEDs) have been under development for about 10 years. GaN-based LEDs represent a significant change in LED technology and are used in a wide range of applications, including natural color LED display devices, LED traffic sign boards, white LEDs, etc. In the future, white LEDs are expected to replace fluorescent lamps, as the efficiency of white LEDs approaches the efficiency of typical fluorescent lamps.

A GaN-based light emitting diode is generally formed by growing epitaxial layers on a substrate, for example, a sapphire substrate, and includes an N-type semiconductor layer, a P-type semiconductor layer, and an active layer interposed there between. Further, an N electrode is formed on the N-type semiconductor layer, and a P electrode is formed on the P-type semiconductor layer. The light emitting diode is electrically connected to, and operated by, an external power source, through these electrodes. Here, electric current is directed from the P-electrode to the N-electrode, through the semiconductor layers.

Generally, since the P-type semiconductor layer has a high specific resistance, electric current is not evenly distributed in the P-type semiconductor layer. Instead, the current is concentrated on a portion of the P-type semiconductor layer having the P-electrode formed thereon, causing current concentration at an edge of the P-type semiconductor layer. The current concentration leads to a reduction in light emitting area, thereby reducing luminous efficacy. To solve such problems, a transparent electrode layer having a low specific resistance is formed on the P-type semiconductor layer, so as to enhance current distribution. In this structure, when supplied from the P-electrode, the electric current is dispersed by the transparent electrode layer before entering the P-type semiconductor layer, thereby increasing a light emitting area of the LED.

However, since the transparency of the transparent electrode layer is dependent upon the thickness thereof, the thickness of the transparent electrode layer is generally limited, thereby limiting the current dispersion. In particular, for a large area LED (having an area of about 1 mm$^2$ or more and a high output), there is a limit to the current dispersion through the transparent electrode layer.

Meanwhile, the electric current flows into the N electrode through the semiconductor layers. Accordingly, the electric current concentrates on a portion of the N-type semiconductor layer adjacent to the N-electrode. That is, the current flowing in the semiconductor layers is concentrated in a region of the N-type semiconductor layer near the N-electrode is formed. Therefore, there is a need for a light emitting diode solving the problem of current concentration within the N-type semiconductor layer.

Typically, various types of electrode structures are used in a light emitting diode, to ensure uniform current dispersion. FIG. 1 illustrates a light emitting diode having a diagonal electrode structure. In FIG. 1, reference numeral 1 denotes an N electrode, 2 denotes a P electrode, 3 denotes an exposed N-type semiconductor layer, and 4 denotes a transparent electrode layer. Referring to FIG. 1, the diagonal electrode structure is highly effective for a small LED, but causes an increasing concentration of electric current on a central region of the LED, as the size of the LED increases, such that only the central region of the LED emits light. In addition, an electrode pattern of a simple facing-type structure also suffers from the same problems as the diagonal electrode structure.

FIG. 2 illustrates a light emitting diode having a combined electrode structure including a facing-type structure and a symmetrical extension-type structure, and FIG. 3 is a cross-sectional view taken along line A-A' of FIG. 2. In FIG. 2 and FIG. 3, reference numeral 11 denotes a substrate, 13 denotes an N-type semiconductor layer, 15 denotes an active layer, 17 denotes a P-type semiconductor layer, 19 denotes a transparent electrode layer, 21 denotes an N electrode, 22 and 23 denote extensions of the N electrode, 31 denotes a P electrode, and 32 and 33 denote extensions of the P electrode.

Referring to FIG. 2 and FIG. 3, the combined electrode structure is generally used for large LEDs. It can be appreciated that the extension 22, 23, 32, 33 are formed over a light emitting area of an LED chip, and have an increased area for ensuring uniform current distribution over the light emitting area.

However, since the N-type semiconductor layer 13 is exposed by mesa-etching used to form the extensions 32, 33 of the P electrode 31 and the extension parts 22, 23 of the N electrode 21, the light emitting area is inevitably decreased. Moreover, in the current state of the art, the number of electrode pads formed on a single chip is more than doubled, for current diffusion, and a mesa-etching area for forming electrodes and extension parts of these electrodes is also expanded. The expansion of the mesa-etching area, caused by the increase in the number of electrode pads, results in a decrease in the light emitting area, based on the same chip area, thereby reducing light emitting efficiency.

It is to be understood that both the foregoing general description and the following detailed description are exemplary and explanatory and are intended to provide further explanation of the invention as claimed.

SUMMARY OF THE INVENTION

An exemplary embodiment of the invention provides a light emitting diode configured to prevent a reduction in light emitting area, resulting from the formation of an electrode and/or electrode pad.

Additional features of the invention will be set forth in the description which follows, and in part will be apparent from the description, or may be learned by practice of the invention. Still other aspects, features, and advantages of the present invention are readily apparent from the following detailed description, simply by illustrating a number of particular embodiments and implementations, including the best mode for carrying out the present invention. The present invention can take the form of a variety of different embodiments, and several details can be modified in various obvious respects, all without departing from the spirit and scope of the present invention. Accordingly, the drawing and description are to be regarded as illustrative in nature, and not as restrictive.

Exemplary embodiments of the present invention disclose a light emitting diode. The light emitting diode includes a lower semiconductor layer formed on a substrate; an upper semiconductor layer disposed above the lower semiconductor layer, to expose a portion of the lower semiconductor layer; a first electrode formed on the upper semiconductor layer and extending onto the exposed portion of the lower semiconductor layer, to supply electric current to the lower semiconductor layer; an insulation layer interposed between the first electrode and the upper semiconductor layer; a second electrode formed the upper semiconductor layer, to supply electric current to the upper semiconductor layer.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
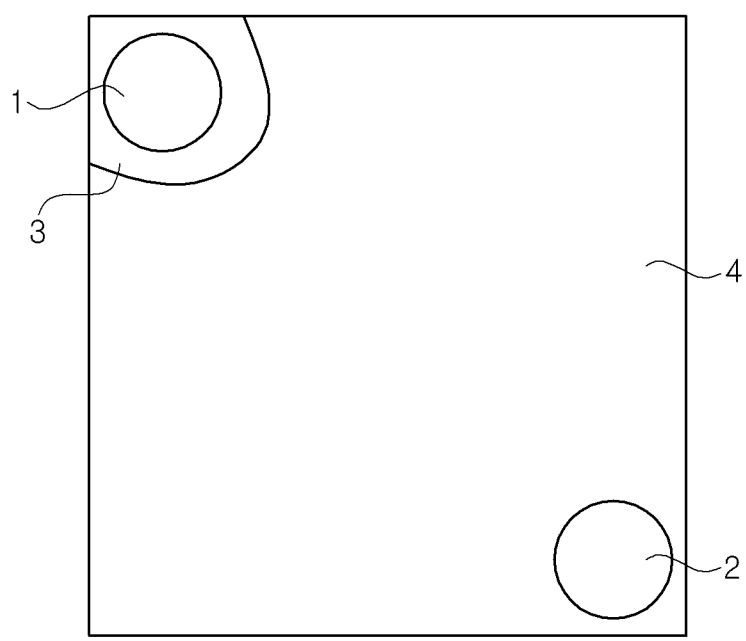
FIG. 1 illustrates a conventional light emitting diode having a diagonal electrode structure.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being formed or disposed "on" another element, it can be directly on the other element, or intervening elements may be present. In contrast, when an element is referred to as being formed or disposed "directly on" another element, there are no intervening elements present. In addition, when an element is referred to as being connected to another element, intervening elements may be present there between. In contrast, when an element is referred to as being directly connected to another element, no intervening elements are present.

Figure 4:
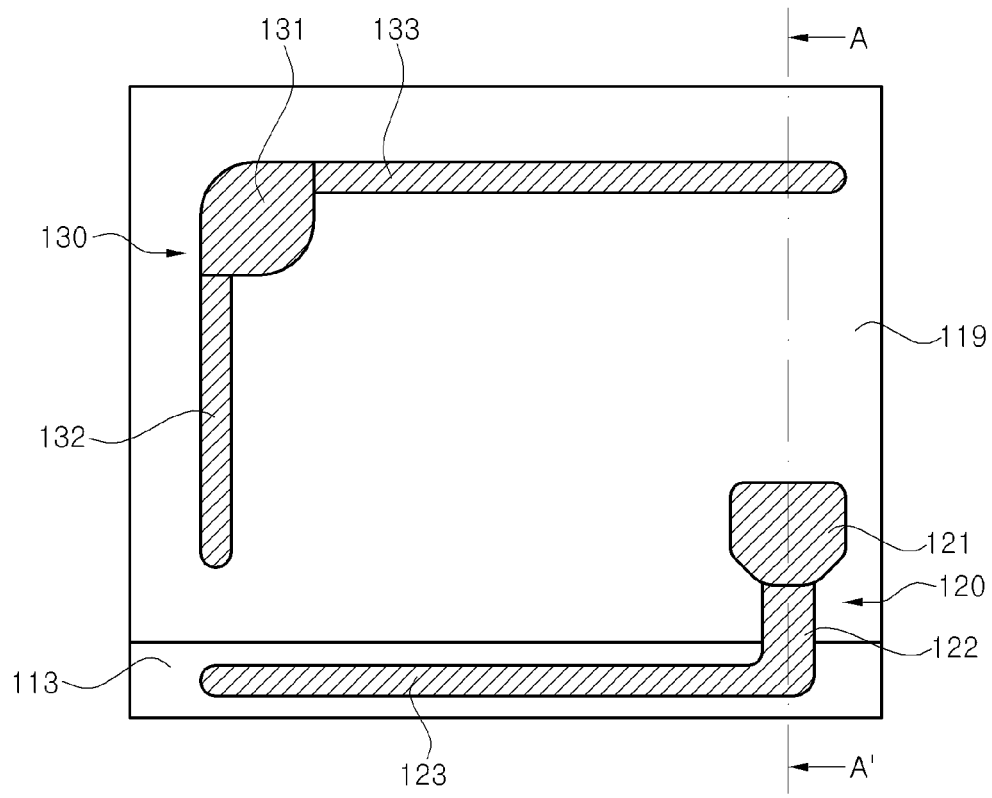
FIG. 4 is a plan view of a light emitting diode, according to one exemplary embodiment of the invention.
Figure 5:
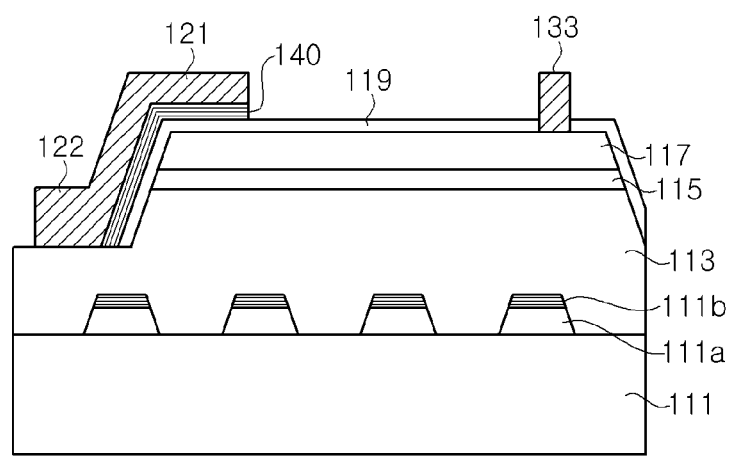
FIG. 5 is a cross-sectional view taken along line A-A of FIG. 4.

FIG. 4 is a plan view of a light emitting diode, according to one exemplary embodiment, and FIG. 5 is a cross-sectional view taken along line A-A of FIG. 4. Referring to FIG. 4 and FIG. 5, a lower semiconductor layer 113 is formed on a substrate 111. The substrate 111 is not limited to a particular material, and may be, for example, a sapphire substrate.

An upper semiconductor layer 117 is formed above the lower semiconductor layer 113. The upper semiconductor layer 117 is positioned within a region surrounded by edges of the lower semiconductor layer 113, so as to expose at least a portion of the lower semiconductor layer 113. Meanwhile, an active layer 115 is interposed between the lower semiconductor layer 113 and the upper semiconductor layer 117. The active layer 115 is positioned under the upper semiconductor layer 117, while exposing edge regions of the lower semiconductor layer 113.

The lower semiconductor layer 113, active layer 115, and upper semiconductor layer 117 may be formed of, for example, a nitride-based compound semiconductor material, such as (B, Al, In, or Ga)N. The active layer 115 includes light-emitting elements, to emit light at desired frequencies, for example, UV or blue light. The lower semiconductor layer 113 and the upper semiconductor layer 117 include materials having a greater band gap than the active layer 115.

As shown in the drawings, the lower semiconductor layer 113 and/or the upper semiconductor layer 117 may have a single layer structure or, in the alternative, may have a multilayer structure. Further, the active layer 115 may have a single quantum well structure or a multi-quantum well structure. The light emitting diode may further include a buffer layer (not shown) disposed between the substrate 111 and the lower semiconductor layer 113. The buffer layer is selected to relieve lattice mismatches between the substrate 111 and the lower semiconductor layer 113.

The semiconductor layers 113, 115, 117 may be in the form of a semiconductor stack (light-emitting unit) formed by metal organic chemical vapor deposition (MOCVD) or molecular beam epitaxy (MBE). The semiconductor stack may be subjected to mesa-etching, to expose regions of the lower semiconductor layer 113, via photolithography and etching processes. As such, the exposed regions of the lower semiconductor layer 113 may have a reduced thickness, as compared to other regions thereof.

Here, mesa-etching may be performed on the semiconductor stack, to form a mesa structure having an inclined side surfaces. The side surfaces may have a degree of inclination in the range of 20~80 degrees, and preferably in the range of 30~60 degrees, with respect to the plane of the substrate 111. The inclined side surfaces may enhance workability and reliability, when forming a second insulation layer 140 and/or an inclined extension 122 of a first electrode 120, as described below. In addition, the inclined mesa structure increases a light emitting area.

An insulation layer is formed on mesa. The insulation layer may include a first insulation layer 119 and a second insulation layer 140. The first insulation layer 119 covers upper and side surfaces of the mesa structure, and may be formed of, for example, $SiO_2$, $Si_3N4$, $Nb_2O_5$, $TiO_2$, etc.

The second insulation layer 140 may be formed on a selected portion of the upper semiconductor layer 117, where the first electrode 120 is to be formed. In particular, the second insulation layer 140 may cover a sidewall and a portion of the upper surface of the mesa structure. The second insulation layer 140 may be formed to have, for example, in a distributed Bragg reflector (DBR) structure, by alternately stacking layers having substantially different indices of refraction. For example, the second insulation layer 140 may be formed by alternately stacking, multiple layers of $SiO_2$ and $TiO_2$, or multiple layers of $SiO_2$ and $Si_3N_4$. The stacked layers may then be etched in a predetermined pattern, using photolithography.

Here, the layers forming the insulation layer 140 are stacked, such that the outermost layers comprise a Si compound, that is, $SiO_2$. $TiO_2$ may suffer from deformation when subjected to thermal stress. Thus, if a $TiO_2$ layer is used as an outermost layer of the second insulation layer 140, by alternately stacking $SiO_2$ and $TiO_2$, the second insulation layer 140 may crack after deposition. However, when stacking multiple $SiO_2$ and $TiO_2$ layers, by first forming a $SiO_2$ on the first insulation layer 119 and then stacking a $TiO_2$ layer on the $SiO_2$ layer, the second insulation layer 140 exhibits good thermal stability, thereby preventing cracking of the second insulation layer 140. Likewise, it is desirable that the formation of the second insulation layer 140 conclude with the deposition of a $SiO_2$. In other words, top and bottom layers of the insulation layer 140 are generally formed of layers having good thermal stability, to improve the reliability of the second insulation layer 140. Since the second insulation layer 140 is formed by alternately stacking layers having different indices of refraction, the second insulation layer 140 may operate as a DBR. Accordingly, when light emitted from the active layer 117 is directed towards the first electrode 120, the second insulation layer 140 may reflect the light, thereby effectively preventing the light from being absorbed or blocked by the first electrode 120. A DBR layer 111b may be formed on patterned sapphire substrate regions 111a of the substrate 111.

Figure 6:
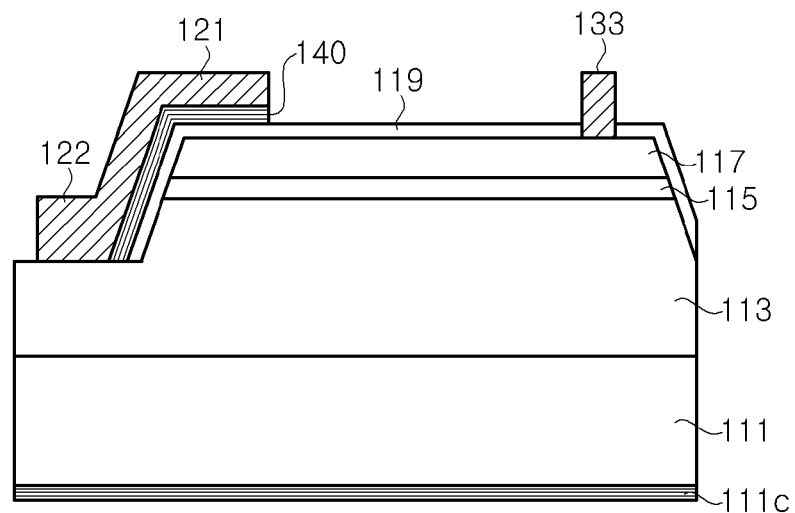
FIG. 6 is a cross-sectional view of a light emitting diode, according to another exemplary embodiment of the invention.

In another embodiment, an insulation layer having a DBR structure is also formed under a second electrode 130, excluding a portion contacting the upper semiconductor layer 117. In another embodiment, an insulation layer having a DBR structure is also formed on an exposed portion of the lower semiconductor layer 113, in order to improve the extraction of light reflected by the second insulation layer 140. In a further embodiment, a lower DBR layer 111c may be formed on a bottom side of the substrate 111, as shown in FIG. 6.

The first electrode 120 includes a first electrode pad 121 formed on the upper semiconductor layer 117. The first electrode 120 includes: an inclined extension 122 that extends from the first electrode pad 121 to the exposed portion of the lower semiconductor layer 113; and a lower extension 123 that extends across the exposed portion of the lower semiconductor layer 113, along a first side of the substrate 111. The first electrode pad 121, the inclined extension 122 and the lower extension 123 may be formed of the same material, using the same process. For example, if the lower semiconductor layer is an N-type semiconductor layer, the first electrode 120 may be formed of Ti/Al, using a lift-off process. The first and second insulation layers 119, 140 are interposed between the first electrode 120 and the mesa structure.

Further, the second electrode 130 is formed on another portion of the upper semiconductor layer 117. The second electrode 130 includes a second electrode pad 131 positioned near a corner of the substrate 111, on the upper semiconductor layer 117. The second electrode 130 also includes a first extension 132 and a second extension 133 that extend in different directions across the upper semiconductor layer 117. The first and second extensions 132, 133 extend from the second electrode pad 131, along adjacent sides of the substrate 111. The second electrode pad 131 and the extensions 132, 133 may be formed of the same material, using the same process.

A transparent electrode layer (not shown) may be formed on the upper semiconductor layer 117, under the first insulation layer 119. Generally, the transparent electrode layer is formed of indium tin oxide (ITO) or Ni/Au. In addition, the transparent electrode layer may lower contact resistance, through ohmic contact with the upper semiconductor layer 117. On the other hand, the second electrode 130 generally is not transparent and does not form substantial ohmic contact with the upper semiconductor layer 117. A portion of the second electrode 130 directly contacts the upper semiconductor layer 117, and another portion of the second electrode 131 directly contacts the transparent electrode layer. Consequently, the second electrode 130 directly contacts the upper semiconductor layer 117, thereby preventing electric current from flowing under the second electrode 130. Therefore, the light is not generated in a portion of the active layer 115 that is covered by the second electrode 130. However, light is generated in areas where the active layer is covered by the transparent electrode layer. With this structure, it is possible to minimize the absorption of light emitted from the active layer 115, by the second electrode 131.

Figure 2:
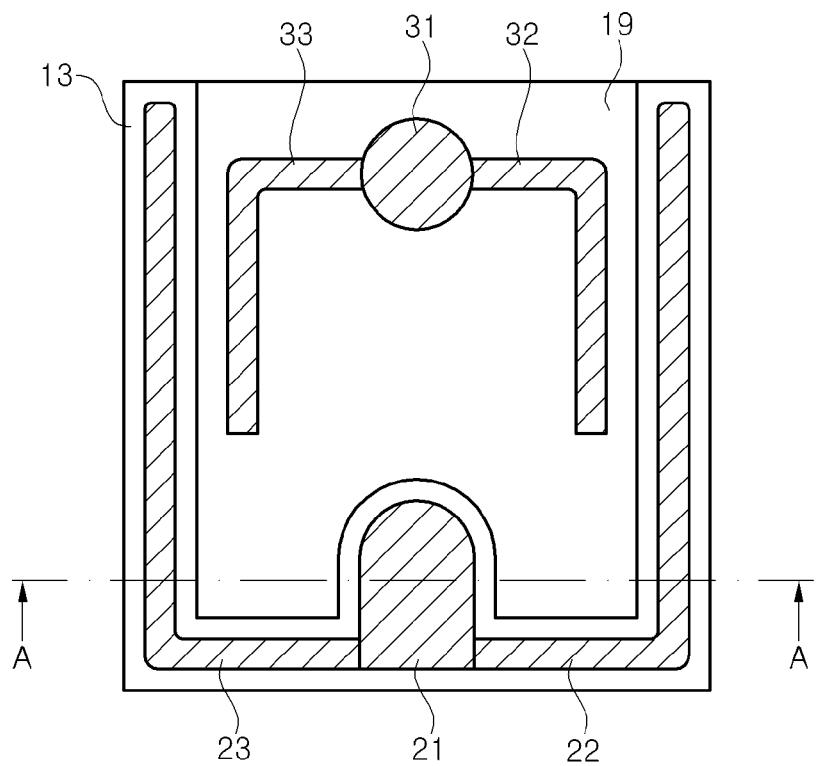
FIG. 2 illustrates a conventional light emitting diode having a combined facing-type and symmetrical extension-type structure.
Figure 3:
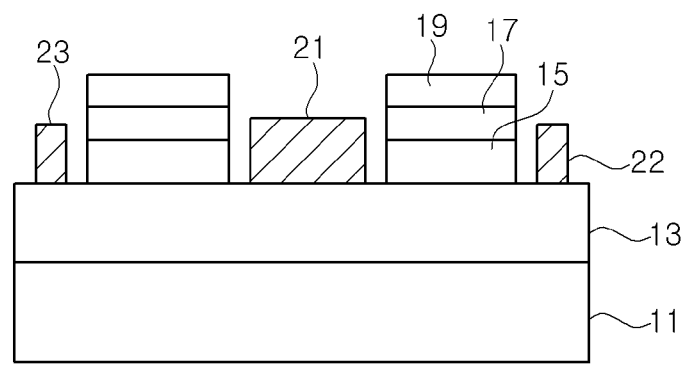
FIG. 3 is a cross-sectional view taken along line A-A' of FIG. 2.

An improvement in the light emitting area of the light emitting diode of FIG. 4, will be shown by a comparison with the light emitting diode of FIG. 2. In FIGS. 2 and 4, it can be seen that there is a great difference between the conventional light emitting diode and the present embodiment, in terms of the reduction in light emitting area by the lower electrode 21 and the first electrode 120. Namely, in the light emitting diode of FIG. 2, a portion of the active layer 15 is removed during the formation of the lower electrode 21, by mesa etching. On the contrary, in the light emitting diode of FIG. 4, since the first electrode pad 121 is formed above the upper semiconductor layer 117, with the first and second insulation layers 119, 140 interposed there between, the active layer 115 remains unetched, where covered. Accordingly, the present exemplary light emitting diode provides an effective solution of the problem of the related art, in which the light emitting area is reduced, due to the formation of the electrode 21.

In addition, as can be seen from FIG. 4, the second insulation layer 140 is formed under the first electrode 120 and reflects light away from the first electrode 120. As such, the second insulation layer 140 increases light extraction efficiency.

Figure 7:
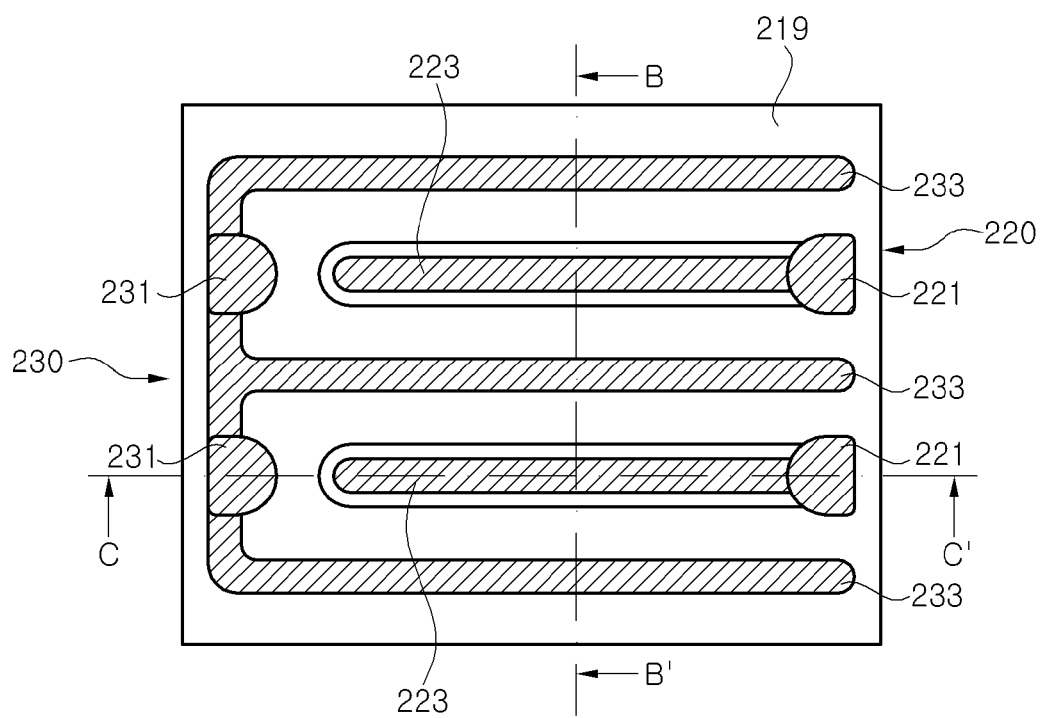
FIG. 7 is a plan view of a light emitting diode, according to a further exemplary embodiment of the invention.
Figure 8:
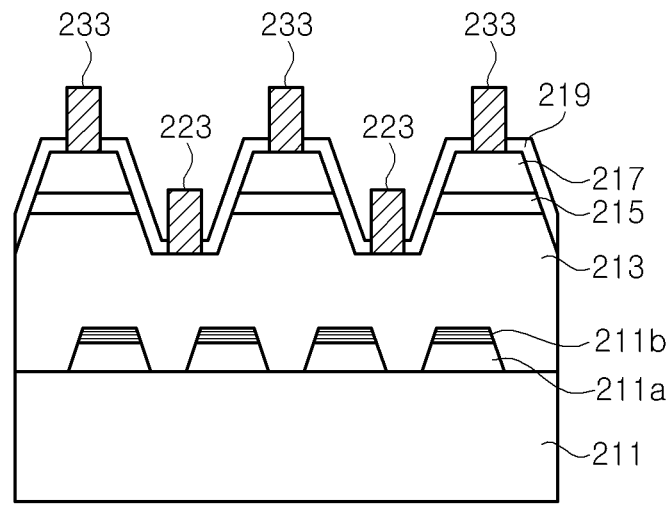
FIG. 8 is a cross-sectional view taken along line B-B' of FIG. 7.
Figure 9:
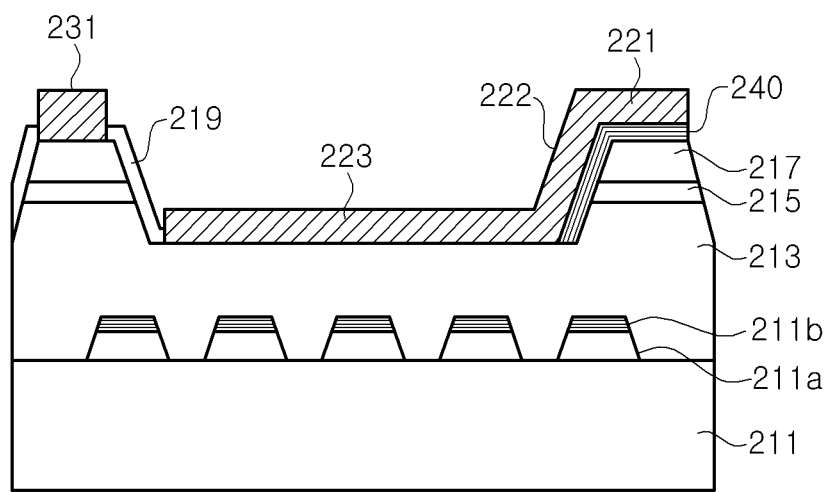
FIG. 9 is a cross-sectional view taken along line C-C' of FIG. 7.

FIG. 7 is a plan view of a light emitting diode, according to a further exemplary embodiment, FIG. 8 is a cross-sectional view taken along line B-B' of FIG. 7, and FIG. 9 is a cross-sectional view taken along line C-C' of FIG. 7. The embodiment shown in FIGS. 7, 8, and 9 is different from the embodiment of FIG. 4 and FIG. 5, in terms of the number, positions and shapes of first and second electrodes, and the shapes of extensions of the first and second electrodes.

Referring to FIGS. 7, 8, and 9, the light emitting diode includes a lower semiconductor layer 213, which is formed on a substrate 211. The substrate 211 is not limited to a particular material, and may be a sapphire substrate, for example.

An upper semiconductor layer 217 is formed to cover the lower semiconductor layer 213. The upper semiconductor layer 217 is smaller than the lower semiconductor layer 213, such that edge regions of the lower semiconductor layer 213 are not covered by the upper semiconductor layer 217. An active layer 215 is interposed between the lower semiconductor layer 213 and the upper semiconductor layer 217. The active layer 215 is larger than the upper semiconductor layer 217, but is smaller than the lower semiconductor layer 213, such that edge regions of the lower semiconductor layer 213 are not covered by the active layer 215.

The lower semiconductor layer 213, active layer 215, and upper semiconductor layer 217 may be formed of, for example, a nitride-based compound semiconductor material, such as (B, Al, In, or Ga)N. The active layer 215 emits light at desired frequencies, for example, UV or blue light. The lower semiconductor layer 213 and the upper semiconductor layer 217 are formed of materials having a greater band gap than that of the active layer 215.

The lower semiconductor layer 213 and/or the upper semiconductor layer 217 may have a single layer structure or may have a multilayer structure. Further, the active layer 215 may have a single quantum well structure or a multi-quantum well structure. The light emitting diode may further include a buffer layer (not shown) disposed between the substrate 211 and the lower semiconductor layer 213. The buffer layer is selected to relieve lattice mismatches between the substrate 211 and the lower semiconductor layer 213.

The semiconductor layers 213, 215, 217 may be in the form of a semiconductor stack formed by MOCVD or MBE. The semiconductor stack may be subjected to mesa-etching, to form a mesa structure, by exposing regions of the lower semiconductor layer 213, via photolithography and etching processes. Here, the mesa structure may include inclined sidewalls. The sidewalls may have a degree of inclination in the range of 20~80 degrees, and preferably in the range of 30~60 degrees, with respect to the plane of the substrate 211. The inclined sidewalls may enhance workability and reliability, when forming a DBR layer 240 and an inclined extension part 222 of the first electrodes 220, as described below. In addition, the inclined sidewalls provide for a increased light emitting area.

An insulation layer is formed on the upper semiconductor layer 217. The insulation layer may include a first insulation layer 219 and a second insulation layer 240. The first insulation layer 219 covers the upper semiconductor layer 217 and the inclined sidewalls. The first insulation layer 219 may be formed of, for example, $SiO_2$, $Si_3N_4$, $Nb_2O_5$, $TiO_2$, etc.

The second insulation layer 240 may be formed on a portion of the upper semiconductor layer 217, where the first electrodes 220 will be formed. The second insulation layer 240 may also cover adjacent portions of the sidewalls where the first electrodes 220 will be formed.

The second insulation layer 240 may have, for example, a DBR structure. The second insulation layer 240 is similar to the second insulation layer 140. As such, a detailed description of the structure/formation of the second insulation layer 240 is omitted.

Since the second insulation layer 240 operates as a DBR, the second insulation layer 240 reflects light emitted from the active layer 217, away from the first electrodes 220. As such, the second insulation layer 240 prevents the light from being absorbed or blocked by the first electrodes 220.

Figure 10:
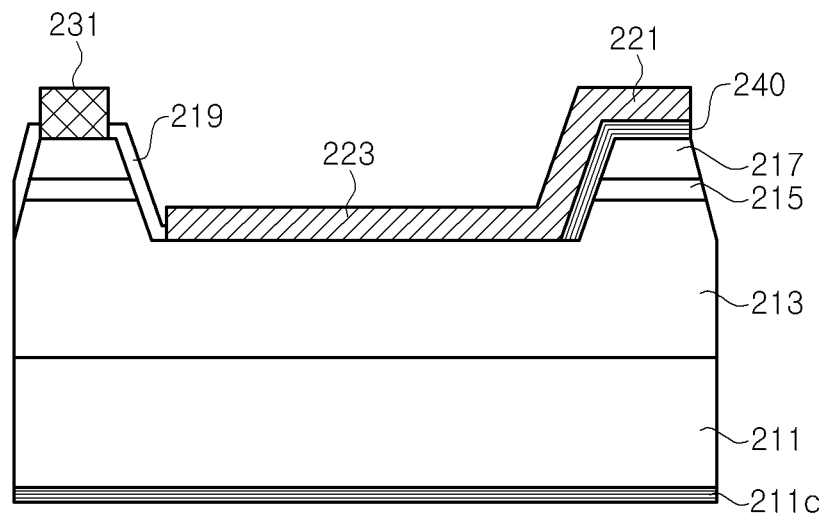
FIG. 10 is a cross-sectional view of a light emitting diode, according to yet another exemplary embodiment of the invention.

Further, a DBR layer 211*b* may be formed on PSS regions 211*a* of the substrate 211. In yet another embodiment, an insulation layer having a DBR structure is also formed under the second electrode 230, excluding portions thereof that contact the upper semiconductor layer 217, in addition to the second insulation layer 240 formed under the first electrodes 220. In yet another embodiment, an insulation layer having a DBR structure is also formed on an exposed portion of the lower semiconductor layer 213, in order to improve the extraction of light reflected by the second insulation layer 240. In yet another embodiment, a lower insulation layer 211*c* including a DBR structure may be formed on a bottom side of the substrate 211, as shown in FIG. 10.

The first electrodes 220 are formed in a first region, on the upper semiconductor layer 217. The first and second insulation layers 219, 240 are interposed between the first electrodes 220 and the upper semiconductor layer 217. The first electrodes 220 each include a first electrode pad 221 an inclined extension 222 that extends from the first electrode pads 221, and an extension 223 that extends from the inclined extension 222, to an exposed portion of the lower semiconductor layer 213. The first electrode pads 221 and the extensions 223, 222 may be formed of the same material, using the same process. For example, if the lower semiconductor layer 213 is an N-type semiconductor layer, the first electrodes 220 may be formed of Ti/Al, using a lift-off process.

Further, the second electrode 230 is on the upper semiconductor layer 217. The second electrode 230 includes second electrode pads 231 positioned near an edge of the upper semiconductor layer 217, opposite to an edge of the upper semiconductor layer 217 where the first electrode pads 221 are disposed. The second electrode 230 further includes extensions 233 that extend from the second electrode pads 231, to an opposing side of the upper semiconductor layer 217. The second electrode pads 231 and the extensions 233 may be formed of the same material, using the same process.

Figure 11:
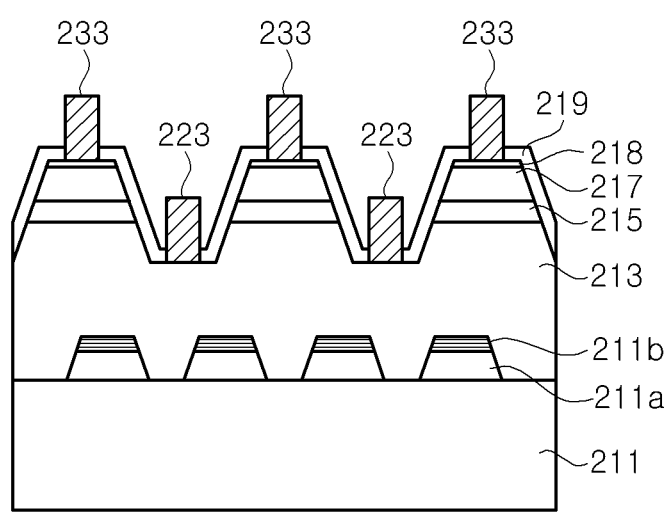
FIG. 11 is a cross-sectional view of a light emitting diode, according to yet another exemplary embodiment of the invention.

A transparent electrode layer 218 may be formed on the upper semiconductor layer 217, before forming the first insulation layer 219, as shown in FIG. 11. Generally, the transparent electrode layer 218 is formed of indium tin oxide (ITO) or Ni/Au. In addition, the transparent electrode layer 218 may lower a contact resistance, through ohmic contact with the upper semiconductor layer 217. On the other hand, the second electrode 230 is generally not transparent and does not form substantial ohmic contact with the upper semiconductor layer 217. A portion of the second electrode 230 contacts the upper semiconductor layer 217, and another portion of the second electrode 230 contacts the transparent electrode layer. Consequently, the second electrode 230 directly contacts the upper semiconductor layer 217, thereby preventing electric current from flowing under the second electrode 230. Therefore, light is not generated in portions of the active layer 215 that are disposed under the second electrode 230, but is generated in portions of the active layer 215 covered by the transparent electrode layer. With this structure, it is possible to minimize the absorption of light emitted from the active layer, by the second electrode 230.

An improvement in the light emitting area of the light emitting diode of FIG. 7 will be described through a comparison with the light emitting diode of FIG. 2. Namely, in the light emitting diode of FIG. 2, portions of the active layer 15 are removed during mesa etching, to form the lower electrode 21. Thus, when the lower electrodes 21 are formed, which correspond to the structure as shown in FIG. 7, the light emitting area can be further reduced by the mesa etching. On the contrary, in the light emitting diode of FIG. 7, the first electrodes 220 are formed above the upper semiconductor layer 217. The first and second insulation layers 219, 240 are interposed between the first electrodes 220 and the upper semiconductor layer 217. Thus, the active layer 215 remains unetched. As such, the light emitting diode of FIG. 7 provides an effective solution to the problem of the related art, in which the light emitting area is reduced, due to the formation of the electrodes.

In addition, as can be seen from FIG. 7 and FIG. 9, the second insulation layer 240 reflects light that would otherwise be absorbed or blocked by the first electrodes 220. As such, according to one embodiment, an electrode including an electrode pad and an extension is formed above an upper semiconductor layer, with an insulation layer interposed between the electrode and the upper semiconductor layer. Consequently, an area of the semiconductor layer removed by mesa-etching used to form the electrode is reduced, thereby preventing a reduction in light emitting area.

Although aspects of the invention have been illustrated with reference to some exemplary embodiments, in conjunction with the drawings, it will be apparent to those skilled in the art that various modifications and changes can be made in the exemplary embodiments, without departing from the spirit and scope of the invention. Therefore, it should be understood that the exemplary embodiments are provided by way of illustration only and are given to provide complete disclosure of the invention and to provide thorough understanding of the invention to those skilled in the art. Thus, it is intended that the invention covers modifications to the disclosed exemplary embodiments that come within the scope of the appended claims and their equivalents.

For example, in the embodiments of the invention, the insulation layer of the DBR structure is formed by alternately stacking two or more insulation layers having different indices of refraction such that the outermost insulation layers are formed of the Si compound, that is, $SiO_2$, to enhance reliability of the DBR structure. However, it should be understood that this feature may also be applied to all insulation layers set forth herein.

What is claimed is:

1. A light emitting diode, comprising:
   a substrate;
   a lower semiconductor layer disposed on the substrate;
   an upper semiconductor layer disposed on the lower semiconductor layer, such that a portion of the lower semiconductor layer is exposed;
   a first electrode disposed on the upper semiconductor layer and directly on the exposed portion of the lower semiconductor layer, to supply electric current to the lower semiconductor layer;
   a second electrode formed on the upper semiconductor layer, to supply electric current to the upper semiconductor layer;
   a first insulation layer extending from the first electrode to the second electrode; and
   a lower insulation layer disposed on a lower surface of the substrate and having a distributed Bragg reflector (DBR) structure.

2. The light emitting diode of claim 1, wherein the first electrode comprises:
   a first electrode pad disposed on the upper surface of the upper semiconductor layer;
   an inclined extension extending from the first electrode pad to the exposed portion of the lower semiconductor layer; and
   a lower extension extending from the inclined extension and disposed directly on the exposed portion of the lower semiconductor layer.

3. The light emitting diode of claim 2, wherein:
   the upper semiconductor layer and the lower semiconductor layer form a mesa structure having an inclined side surface; and
   the inclined extension extends across the inclined side surface, from the upper semiconductor layer to the lower semiconductor layer.

4. The light emitting diode of claim 1, further comprising a second insulation layer configured to electrically insulate the upper semiconductor layer from a portion of the first electrode that is disposed on upper insulating layer.

5. The light emitting diode of claim 4, wherein the second insulation layer has a distributed Bragg reflector (DBR) structure.

* * * * *